US011854885B2

(12) United States Patent
Chang (10) Patent No.: US 11,854,885 B2
(45) Date of Patent: Dec. 26, 2023

(54) SEMICONDUCTOR STRUCTURE, FORMING METHOD THEREOF, AND SEMICONDUCTOR DEVICE

(71) Applicant: CHANGXIN MEMORY TECHNOLOGIES, INC., Hefei (CN)

(72) Inventor: Chih-Wei Chang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 316 days.

(21) Appl. No.: 17/441,875

(22) PCT Filed: Apr. 12, 2021

(86) PCT No.: PCT/CN2021/086457
§ 371 (c)(1),
(2) Date: Sep. 22, 2021

(87) PCT Pub. No.: WO2021/208831
PCT Pub. Date: Oct. 21, 2021

(65) Prior Publication Data
US 2023/0055577 A1 Feb. 23, 2023

(30) Foreign Application Priority Data
Apr. 16, 2020 (CN) .................. 202010299484.X (51) Int. Cl.
*H01L 21/768* (2006.01)
*H01L 23/48* (2006.01)
(Continued)

(52) U.S. Cl.
CPC .... *H01L 21/76898* (2013.01); *H01L 21/7684* (2013.01); *H01L 21/76816* (2013.01);
(Continued)

(58) Field of Classification Search
CPC ......... H01L 21/76898; H01L 21/76816; H01L 21/7684; H01L 21/76871; H01L 21/76879;
(Continued)

(56) References Cited

U.S. PATENT DOCUMENTS 10,312,143 B2 6/2019 Migita et al.

FOREIGN PATENT DOCUMENTS

CN 106206501 A 12/2016
CN 108155234 A 6/2018
(Continued)

OTHER PUBLICATIONS

International Search Report cited in PCT/CN2021/086457 dated Jun. 25, 2021, 9 pages.

*Primary Examiner* — Robert G Bachner
(74) *Attorney, Agent, or Firm* — Cooper Legal Group, LLC (57) ABSTRACT

The present disclosure provides a semiconductor structure, a forming method thereof, and a semiconductor device, and relates to the technical field of semiconductor packaging processes. The method includes: providing a semiconductor substrate; forming an oxide layer on a surface of the semiconductor substrate, and etching the oxide layer to form a recess, where a through-silicon via (TSV) is provided in the semiconductor substrate and the oxide layer, and an upper end of the TSV is connected to the recess; depositing a metal layer on a surface of the recess, and forming an opening in the metal layer on a bottom surface of the recess, where the opening is connected to the TSV; and filling a second conductive material into the recess, and forming a hole in the second conductive material above the opening.

13 Claims, 5 Drawing Sheets

(51) Int. Cl.
*H01L 23/528* (2006.01)
*H01L 23/532* (2006.01)
(52) U.S. Cl.
CPC .. *H01L 21/76871* (2013.01); *H01L 21/76879* (2013.01); *H01L 23/481* (2013.01); *H01L 23/5283* (2013.01); *H01L 23/53238* (2013.01); *H01L 23/53266* (2013.01)
(58) Field of Classification Search
CPC ............... H01L 23/481; H01L 23/5283; H01L 23/53238; H01L 23/53266; H01L 21/76873; H01L 21/76877; H01L 24/05; H01L 23/538; H01L 21/76843; H01L 23/528; H01L 2221/1084
See application file for complete search history.

(56) References Cited

FOREIGN PATENT DOCUMENTS

| | | |
|---|---|---|
| CN | 209119092 U | 7/2019 |
| EP | 3333897 A1 | 6/2018 |
| JP | 2012142414 A | 7/2012 |

SEMICONDUCTOR STRUCTURE, FORMING METHOD THEREOF, AND SEMICONDUCTOR DEVICE

CROSS REFERENCE TO RELATED APPLICATION

This patent disclosure claims the benefit and priority of Chinese Patent Application No. 202010299484.X, filed on Apr. 16, 2020 and entitled "SEMICONDUCTOR STRUCTURE, FORMING METHODTHEREOF, AND SEMICONDUCTOR DEVICE", the disclosure of which is incorporated by reference herein in its entirety as part of the present disclosure.

TECHNICAL FIELD

The present disclosure relates to the technical field of semiconductor packaging processes, in particular to a semiconductor structure, a forming method thereof, and a semiconductor device.

BACKGROUND

With the shrinking of the feature size of the semiconductor integrated circuit devices, the requirements for the semiconductor packaging processes technology are becoming increasingly stringent. The through-silicon via (TSV) packaging technology is to connect the chips vertically to realize the interconnection between the chips. It can realize the maximum stacking density in the three-dimensional (3D) direction and minimum overall size of the chips, and substantially improve speed and lower the power consumption performance of the chips.

The manufacturing process of the TSV packaging technology involves wafer hetero-bonding. It needs to control the depth of the contact surface of the metal pad at 1 to 5 nm, which imposes extremely high requirements for the process technology, making it hard to control. If the metal pad is too deep, there will be an open circuit between the metals and cannot be connected. If the metal pad is too shallow, when the metal pad is squeezed by the bonding surface, it will be separated even after bonding or short-circuit with the adjacent metal pad. Therefore, it is necessary to control the stability of the back-side via exposure device in the chemical-mechanical process and improve the ability of wafer bonding, which is a technical problem that needs to be solved urgently.

SUMMARY

The present disclosure provides a method of forming a semiconductor structure. The method comprises:
providing a semiconductor substrate;
forming an oxide layer on a surface of the semiconductor substrate, and etching the oxide layer to form a recess, where a through-silicon via is provided in the semiconductor substrate and the oxide layer, and an upper end of the through-silicon via is connected to the recess;
depositing a metal layer on a surface of the recess, and forming an opening in the metal layer on a bottom surface of the recess, where the opening is connected to the through-silicon via; and
filling a second conductive material into the recess, and forming a hole in the second conductive material above the opening.

Correspondingly, the present disclosure further provides a semiconductor structure. The semiconductor structure comprises:
a semiconductor substrate;
an oxide layer, provided on a surface of the semiconductor substrate, and provided with a recess at the top;
a through-silicon via formed in the semiconductor substrate and the oxide layer and filled with a first conductive material, where an upper end of the through-silicon via is connected to the recess; and
a metal layer provided on a surface of the recess, where an opening is provided in the metal layer on a bottom surface of the recess; the opening is connected to the through-silicon via; the recess is filled with a second conductive material; a hole is formed in the second conductive material above the opening.

Correspondingly, the present disclosure further provides a technical solution: a semiconductor device including the semiconductor structure according to any one of the above.

DETAILED DESCRIPTION

To describe the technical solutions in the embodiments of the present disclosure more clearly, the accompanying drawings required to describe the embodiments of the present disclosure are briefly described below. Apparently, the accompanying drawings described below are only some embodiments of the present disclosure. A person of ordinary skill in the art may further obtain other accompanying drawings based on these accompanying drawings without creative efforts.

Step 1: A semiconductor substrate is provided, where a surface of the semiconductor substrate is provided with an exposed conductive structure.

Figure 1:
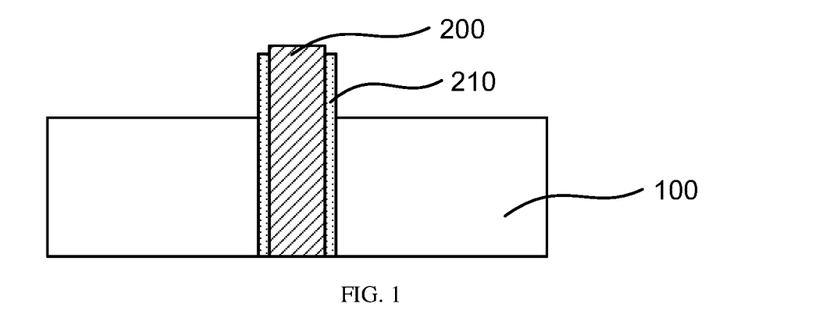
FIGS. 1 to 8 are schematic diagrams of structures obtained by implementing various steps in a method of forming a semiconductor structure according to an embodiment of the present disclosure.

Referring to FIG. 1, the semiconductor substrate 100 is provided therein with a conductive structure 200. One end of the conductive structure 200 is located on a second surface of the semiconductor substrate 100, and the other end of the conductive structure 200 is built into a first surface of the semiconductor substrate 100. In this embodiment, the semiconductor substrate 100 is a wafer. The first surface is a back face of the wafer, and the second surface is a front face of the wafer. A part of the semiconductor substrate layer on the first surface is removed by etching process and grinding process to expose the conductive structure 200. The conductive structure 200 is exposed on the first surface of the semiconductor substrate 100 to form the semiconductor substrate 100 with the exposed conductive structure 200.

The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

The exposed conductive structure 200 passes through the surface of the semiconductor substrate 100. The exposed conductive structure 200 may be formed as follows: form a hole in the semiconductor substrate 100, fill the hole with a first conductive material to form the conductive structure, and remove a part of the semiconductor substrate 100 to form the exposed conductive structure 200. The conductive material may be, but is not limited to, tungsten and copper and other related conductive materials used in an integrated circuit. Further, an insulating layer 210 is provided on a sidewall of the conductive structure 200. The insulating layer 210 may be made of silicon oxide or silicon nitride to prevent the conductive material from entering the semiconductor substrate or the oxide layer. The material of the insulating layer may preferably be silicon oxide or silicon nitride. In other embodiments, the material of the insulating layer 210 may also be other related insulating materials used in an integrated circuit, and is not limited to this embodiment. When the conductive structure 200 is a structure in which a conductive material is filled into a hole, the height of the insulating layer 210 may be smaller than the height of the hole, or it may be flush with the hole. In this case, the function of the insulating layer 210 is to electrically isolate the hole from the substrate 100. In addition, an isolation layer may be provided between the insulating layer 210 and the conductive structure 200 to prevent the conductive material from migrating to the substrate and enhance the adhesion between the conductive material and the insulating layer.

Figure 2:
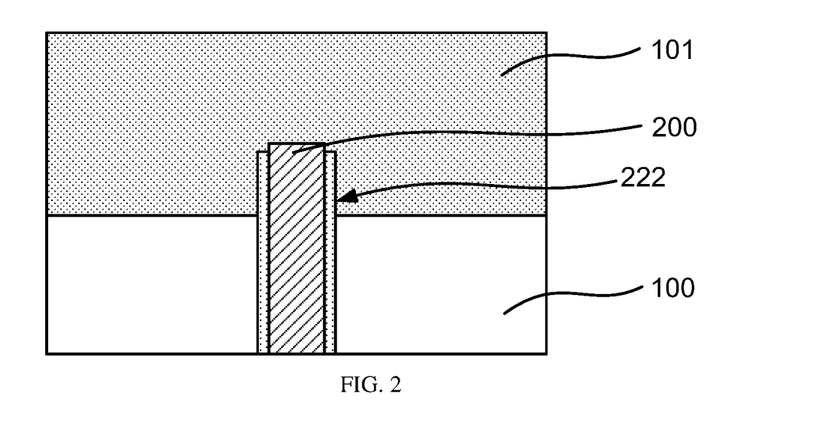

Step 2: Referring to FIG. 2, an oxide layer 101 is formed on the surface of the semiconductor substrate 100 and the surface of the exposed conductive structure 200. A portion of the semiconductor substrate 100 and the oxide layer 101 penetrated by the conductive structure 200 is defined as a through-silicon via (TSV) 222.

In embodiments of the disclosure, an oxide layer 101 is deposited on the surface of the semiconductor substrate 100 and the surface of the exposed conductive structure 200 by a deposition process. In the thin film deposition process, there are two main deposition methods: chemical vapor deposition (CVD) and physical vapor deposition (PVD). CVD is a growth technology in which one or several substances of gas are activated in a certain way and undergo a chemical reaction on the surface of a substrate to deposit a required solid thin film. PVD is a technology that uses a certain physical process to achieve the transfer of substances, that is, to transfer atoms or molecules to the surface of a silicon substrate and deposit them into a thin film. Thin film deposition processes further include spin coating and electroplating, etc. In this embodiment, the specific deposition process of the oxide layer 101 may vary. For example, the CVD process may be used to deposit an oxide layer 101 with a predetermined thickness distribution on the surface of the semiconductor substrate 100. Further, the control means for controlling the flow velocity of the introduced gas flow, controlling the flow rate of the introduced gas flow, controlling the deposition time or controlling the deposition temperature may be used alone. By improving the control accuracy of the gas flow and temperature, it can ensure that all atoms are arranged neatly during deposition to form a monocrystalline layer. Finally, an oxide layer 101 with a uniform thickness is formed on the surface of the semiconductor substrate 100 and the surface of the exposed conductive structure 200.

Commonly used deposition materials include silicon dioxide, silicon nitride and other insulating materials used for isolating interconnection layers. Therefore, the materials of the oxide layer 101 may include, but are not limited to, silicon dioxide, silicon nitride, silicon oxynitride and other related insulating materials used in an integrated circuit.

Further, a first oxide layer and a second oxide layer are sequentially deposited on the surface of the semiconductor substrate 100 from bottom to top, and a recess W is formed at the top of the second oxide layer.

Figure 3:
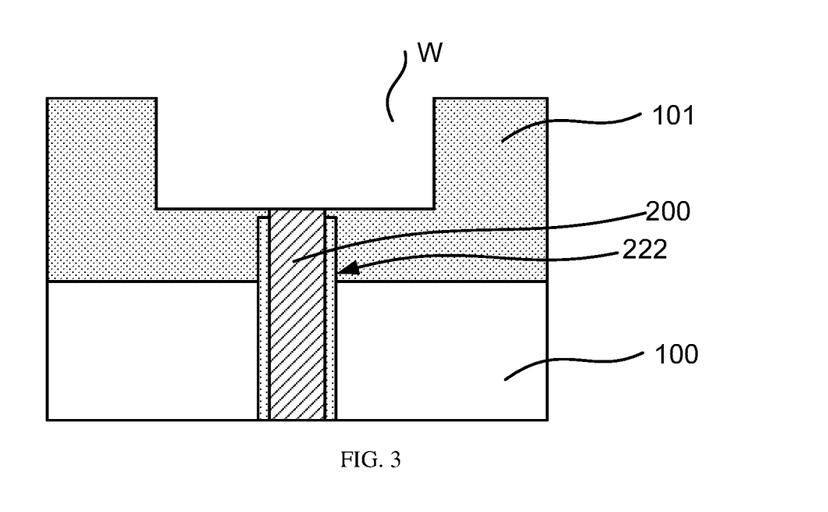

Step 3: Referring to FIG. 3, a surface of the oxide layer 101 is etched to form a recess W, where the recess W is connected to the conductive structure 200.

In embodiments of the disclosure, before the oxide layer 101 is etched, a patterned photoresist layer (not shown) is further formed on the surface of the oxide layer 101. The photoresist layer is provided with patterns arranged at intervals. According to the patterns arranged at intervals on the photoresist layer, the oxide layer 101 is etched, such that the patterns of the photoresist layer are transferred to the oxide layer 101.

Further, the recess has a size of 5-30 μm, that is, the recess has a depth of 5-30 μm. The recess may be a circular or a polygonal. Those skilled in the art may understand that, in the packaging process, the TSV process needs to connect a semiconductor substrate, a conductive structure and a via to meet the requirements of other subsequent process steps.

Figure 4:
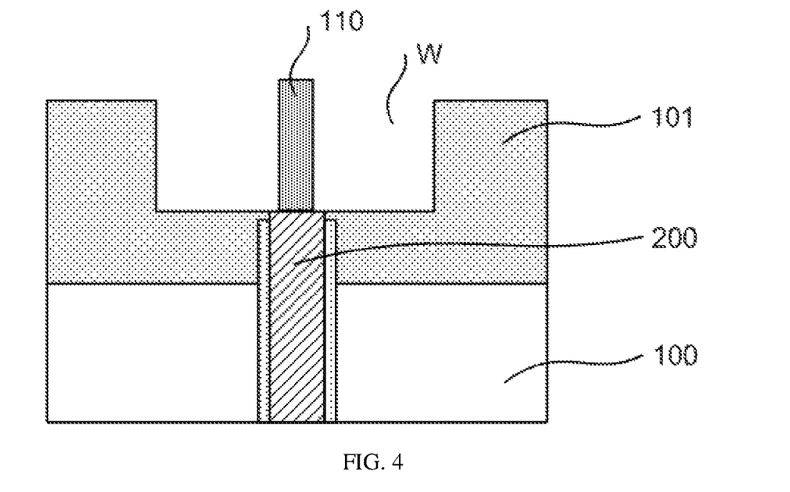

Step 4: Referring to FIG. 4, a patterned mask layer 110 is formed on a surface of the recess.

In embodiments of the disclosure, after the above etching, a mask layer is covered on a bottom surface of the etched recess to perform a photolithographic exposure and development process, a model, that is, a patterned pattern, is reserved on the mask layer according to the size and shape of a hole in the metal layer, and parts other than the pattern of the mask layer are removed. The hole 201 (shown in FIG. 7) may have a circular or a polygonal cross section. If the cross section of the hole 201 (shown in FIG. 7) in the metal layer is a polygonal, the cross section of the pattern on the mask layer may be set to also be a polygonal.

The mask layer is subjected to a photolithographic process. Those skilled in the art may understand that the material of the mask layer is a photoresist. Photoresist is a large class of high-molecular-weight polymer materials that have photosensitive chemical operations or are sensitive to electron energy, and it serves as a medium for transferring a pattern by ultraviolet exposure or electron beam exposure. The photoresist is used as an anti-etching layer to protect the surface of the substrate, and it is typically uniformly covered on the surface of the substrate in the form of a film. When the photoresist is irradiated by ultraviolet light or electron beams, the properties of the photoresist material itself changes. After being developed by a developer, the exposed negative photoresist or the unexposed positive photoresist remains on the surface of the substrate, thereby transferring the designed micro-nano structure to the photoresist. The subsequent etching, deposition and other processes will further transfer the pattern to the trench under the photoresist. Finally, parts other than the pattern of the photoresist layer are removed by a photoresist remover.

In this embodiment, according to the actual situation required by the semiconductor structure, the pattern of the mask layer 110 may be set as an opening shape.

Figure 5:
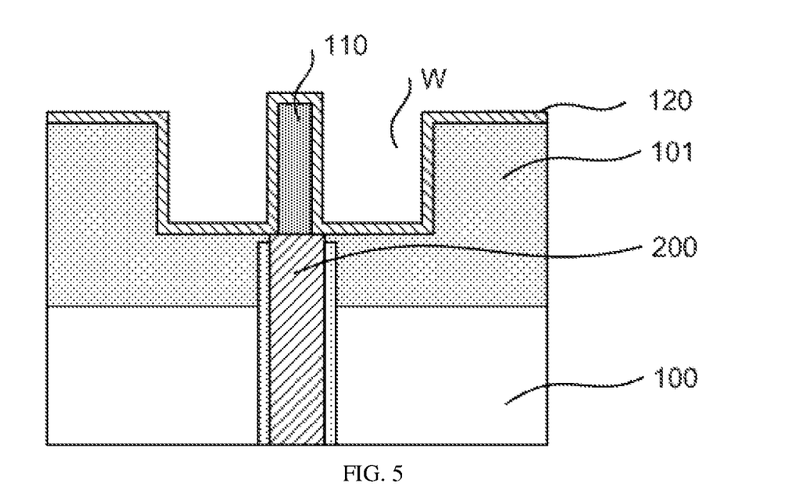

Step 5: Referring to FIG. 5, a metal layer 120 is deposited on the surface of the recess W.

The metal layer 120 needs to be deposited on the surface of the recess W after the above etching by a sputtering process. In this embodiment, by controlling the deposition rate, the metal layer 120 is deposited on the surface of the recess W. The metal layer may also be defined as a seed layer. The metal layer 120 is made of copper. The metal layer 120 has a thickness of 100 nm. In order to facilitate the filling of a conductive material in the subsequent process, the copper seed layer may be formed in advance in this step.

Figure 6:
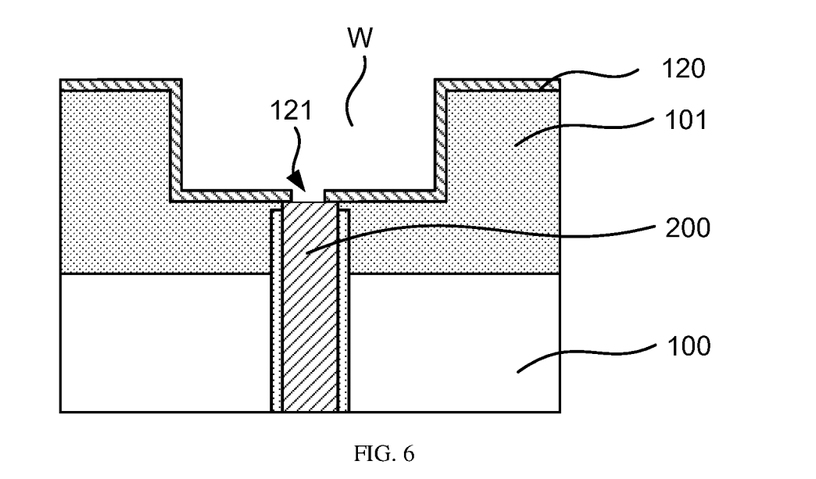

Step 6: Referring to FIG. 6, the mask layer 110 is removed and the aperture pattern is transferred to the metal layer 120. Therefore, an opening 121 is formed in the metal layer 120 on a bottom surface of the recess W, where the opening 121 is connected to the TSV 222.

Figure 7:
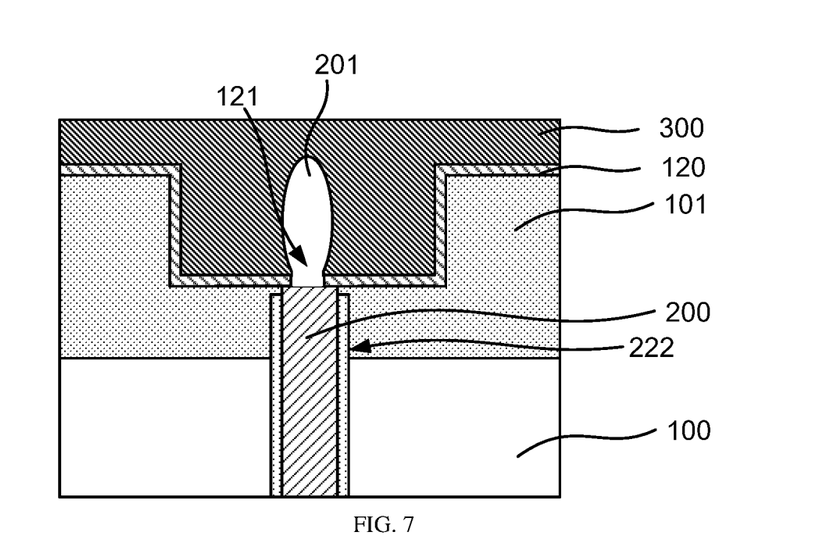

Step 7: Referring to FIG. 7, a second conductive material 300 is filled into the recess, and a hole 201 is formed in the second conductive material 300 above the opening 121, where the hole 201 is connected to the conductive structure 200.

In embodiments of the disclosure, the metal is filled into the recess W by an electrochemical plating (ECP) process. Due to the opening shape of the metal layer 120, the hole 201 is formed in the second conductive material 300. The hole 201 is butted with the opening. A radial dimension of a cross section of the hole 201 ranges from 2 to 20 μm. The cross section of the hole 201 is a circular or a polygonal.

Further, the second conductive material and the first conductive material may be made of the same material, or different materials. The conductive materials may flow in the TSV and the recess through the opening. When thermal expansion occurs, the first conductive material in the TSV 222 may enter the recess through the opening 121 and be accommodated by the hole in the recess.

Figure 8:
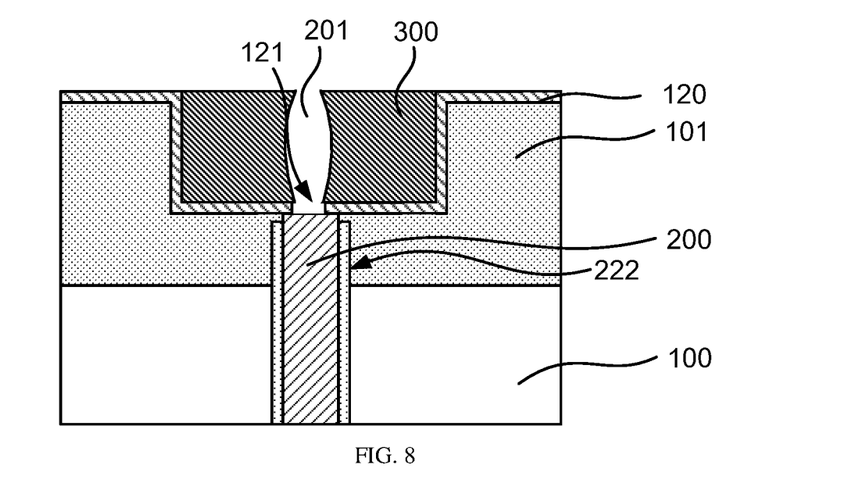

Step 8: Referring to FIG. 8, after the second conductive material 300 is filled into the recess, an excess of the second conductive material 300 on a surface of the oxide layer 101 is planarized by a chemical mechanical polishing (CMP) technique. The material of the second conductive material 300 may be, but is not limited to, tungsten and copper and other related conductive materials used in an integrated circuit.

In this embodiment, a hole formed in the metal layer as a buffer for the thermal expansion of the metal during heterobonding, thereby controlling the stability of the back-side via exposure device in the chemical-mechanical process, and also enhancing the ability of bonding. Therefore, the present disclosure improves the performance and reliability of the semiconductor structure after packaging.

An embodiment of the present disclosure further provides another method of forming a semiconductor structure.

Step 1: A semiconductor substrate is provided, where a surface of the semiconductor substrate is provided with an exposed conductive structure.

Referring to FIG. 1, the semiconductor substrate 100 is provided therein with a conductive structure 200. One end of the conductive structure 200 is located on a second surface of the semiconductor substrate 100, and the other end of the conductive structure 200 is built into a first surface of the semiconductor substrate 100. In an embodiment, the semiconductor substrate 100 is a wafer. The first surface is a back face of the wafer, and the second surface is a front face of the wafer. A part of the semiconductor substrate layer on the first surface is removed by a grinding process to expose the conductive structure 200. The conductive structure 200 is exposed on the first surface of the semiconductor substrate 100 to form the semiconductor substrate 100 with the exposed conductive structure 200.

The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

The exposed conductive structure 200 passes through the surface of the semiconductor substrate 100. The exposed conductive structure 200 may be formed as follows: form a hole in the semiconductor substrate 100, fill the hole with a first conductive material to form the conductive structure, and remove a part of the semiconductor substrate 100 to form the exposed conductive structure 200. The conductive material may be, but is not limited to, tungsten and copper and other related conductive materials used in an integrated circuit. Further, an insulating layer 210 is provided on a sidewall of the conductive structure 200. The insulating layer 210 may be made of silicon oxide or silicon nitride to prevent the conductive material from entering the semiconductor substrate or the oxide layer. The material of the insulating layer may preferably be silicon oxide or silicon nitride. In other embodiments, the material of the insulating layer 210 may also be other related insulating materials used in an integrated circuit, and is not limited to this embodiment. When the conductive structure 200 is a structure in which a conductive material is filled into a hole, the height of the insulating layer 210 may be smaller than the height of the hole, or it may be flush with the hole. In this case, the function of the insulating layer 210 is to electrically isolate the hole from the substrate 100. In addition, an isolation layer may be provided between the insulating layer 210 and the conductive structure 200 to prevent the conductive material from migrating to the substrate and enhance the adhesion between the conductive material and the insulating layer.

Step 2: Referring to FIG. 2, an oxide layer 101 is formed on the surface of the semiconductor substrate 100 and the surface of the exposed conductive structure 200. A portion of the semiconductor substrate 100 and the oxide layer 101 penetrated by the conductive structure 200 is defined as a TSV 222.

In embodiments of the disclosure, an oxide layer 101 is deposited on the surface of the semiconductor substrate 100 and the surface of the exposed conductive structure 200 by a deposition process. In the thin film deposition process, there are two main deposition methods: CVD and PVD. CVD is a growth technology in which one or several substances of gas are activated in a certain way and undergo a chemical reaction on the surface of a substrate to deposit a required solid thin film. PVD is a technology that uses a certain physical process to achieve the transfer of substances, that is, to transfer atoms or molecules to the surface of a silicon substrate and deposit them into a thin film. Thin film deposition processes further include spin coating and electroplating, etc. In this embodiment, the specific deposition process of the oxide layer 101 may vary. For example, the CVD process may be used to deposit an oxide layer 101 with a predetermined thickness distribution on the surface of the semiconductor substrate 100. Further, the control means for controlling the flow velocity of the introduced gas flow, controlling the flow rate of the introduced gas flow, controlling the deposition time or controlling the deposition temperature may be used alone. By improving the control accuracy of the gas flow and temperature, it can ensure that all atoms are arranged neatly during deposition to form a monocrystalline layer. Finally, an oxide layer 101 with a uniform thickness is formed on the surface of the semiconductor substrate 100 and the surface of the exposed conductive structure 200.

Commonly used deposition materials include silicon dioxide, silicon nitride and other insulating materials used for isolating interconnection layers. Therefore, the materials of the oxide layer 101 may include, but are not limited to, silicon dioxide, silicon nitride, silicon oxynitride and other related insulating materials used in an integrated circuit.

Further, a first oxide layer and a second oxide layer are sequentially deposited on the surface of the semiconductor substrate 100 from bottom to top, and a recess W is formed at the top of the second oxide layer.

Step 3: Referring to FIG. 3, a surface of the oxide layer 101 is etched to form a recess W, where an upper end of the TSV is connected to the recess W, and the recess W is connected to the conductive structure 200. In embodiments of the disclosure, before the oxide layer 101 is etched, a patterned photoresist layer (not shown) is further formed on the surface of the oxide layer 101. The photoresist layer is provided with patterns arranged at intervals. According to the patterns arranged at intervals on the photoresist layer, the oxide layer 101 is etched, such that the patterns of the photoresist layer are transferred to the oxide layer 101.

Further, the recess has a size of 5-30 μm, that is, the recess has a depth of 5-30 μm. The recess may be a circular or a polygonal. Those skilled in the art may understand that, in the packaging process, the TSV process needs to connect a semiconductor substrate, a conductive structure and a via to meet the requirements of other subsequent process steps.

Step 4: Referring to FIG. 4, a patterned mask layer 110 is formed on a surface of the recess W.

In embodiments of the disclosure, after the above etching, a mask layer is covered on a bottom surface of the etched recess to perform a photolithographic exposure and development process, a model, that is, a patterned pattern, is reserved on the mask layer according to the size and shape of a hole in the metal layer, and parts other than the pattern of the mask layer are removed. The hole 201 (shown in FIG. 7) may have a circular or a polygonal cross section. If the cross section of the hole 201 (shown in FIG. 7) in the metal layer is a polygonal, the cross section of the pattern on the mask layer may be set to also be a polygonal.

The mask layer is subjected to a photolithographic process. Those skilled in the art may understand that the material of the mask layer is a photoresist. Photoresist is a large class of high-molecular-weight polymer materials that have photosensitive chemical operations or are sensitive to electron energy, and it serves as a medium for transferring a pattern by ultraviolet exposure or electron beam exposure. The photoresist is used as an anti-etching layer to protect the surface of the substrate, and it is typically uniformly covered on the surface of the substrate in the form of a film. When the photoresist is irradiated by ultraviolet light or electron beams, the properties of the photoresist material itself changes. After being developed by a developer, the exposed negative photoresist or the unexposed positive photoresist remains on the surface of the substrate, thereby transferring the designed micro-nano structure to the photoresist. The subsequent etching, deposition and other processes will further transfer the pattern to the trench under the photoresist. Finally, parts other than the pattern of the photoresist layer are removed by a photoresist remover.

In this embodiment, according to the actual situation required by the semiconductor structure, the pattern of the mask layer 110 is set as an opening shape.

Step 5: Referring to FIG. 5, a metal layer 120 is deposited on the surface of the recess W.

The metal layer 120 needs to be deposited on the surface of the recess W after the above etching by a sputtering process. In this embodiment, by controlling the deposition rate, the metal layer 120 is deposited on the surface of the recess W. The metal layer may also be defined as a seed layer. The metal layer 120 is made of copper. The metal layer 120 has a thickness of 100 nm. In order to facilitate the filling of a conductive material in the subsequent process, the copper seed layer may be formed in advance in this step.

Figure 9:
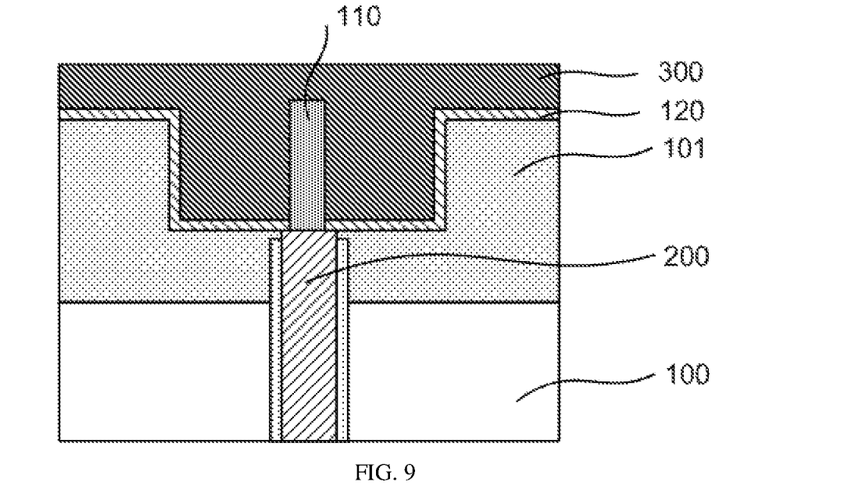
FIGS. 9 to 11 are schematic diagrams of structures obtained by implementing various steps in a method of forming a semiconductor structure according to another embodiment of the present disclosure.

Step 6: Referring to FIG. 9, a second conductive material 300 is deposited on a surface of the metal layer 120 and filled into the recess.

In embodiments of the disclosure, the metal is filled into the recess W by an ECP process. The material of the second conductive material 300 may be, but is not limited to, tungsten and copper and other related conductive materials used in an integrated circuit.

Figure 10:
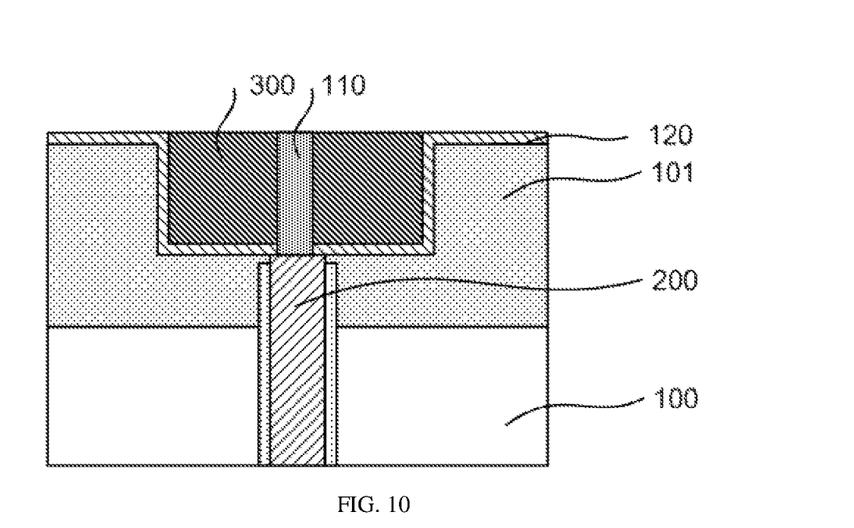

Step 7: Referring to FIG. 10, after the second conductive material 300 is filled into the recess, an excess of the second conductive material 300 on a surface of the oxide layer 101 is planarized by a CMP process.

Figure 11:
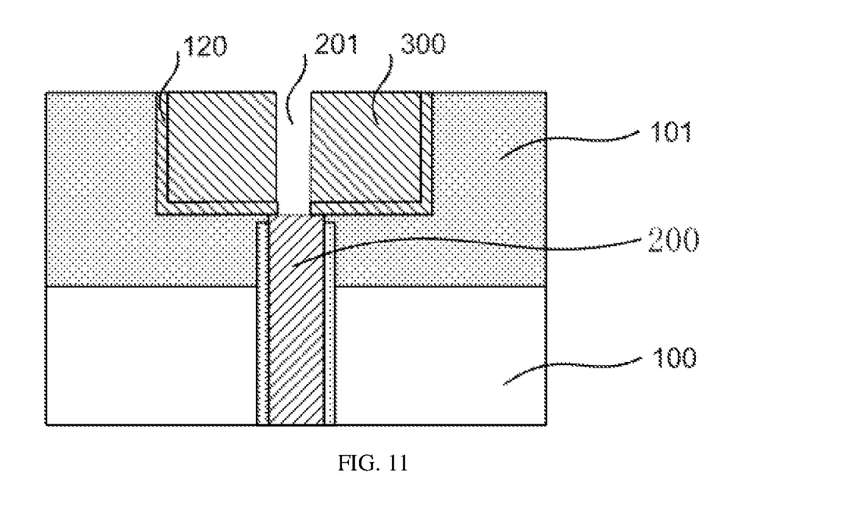

Step 8: Referring to FIG. 11, the mask layer 110 is removed.

As the pattern of the mask layer 110 is transferred to the metal layer 120 and the second conductive material 300, a hole 201 is formed in the second conductive material 300. The hole 201 is located in the center of the recess. A diameter of a cross section of the hole is 2-20 μm. The cross section of the hole is a circular or a polygonal.

Therefore, a hole 201 connected to the conductive structure 200 is formed in the second conductive material 300.

In this embodiment, a hole formed in the metal layer as a buffer for the thermal expansion of the metal during heterobonding, thereby controlling the stability of the back-side via exposure device in the chemical-mechanical process, and also enhancing the ability of bonding. Therefore, the present disclosure improves the performance and reliability of the semiconductor structure after packaging.

An embodiment of the present disclosure further provides a semiconductor structure.

Referring to FIG. 8, the semiconductor structure includes: a semiconductor substrate 100, a conductive structure 200, an oxide layer 101, a recess W, a metal layer 120, a hole 201 and a second conductive material 300.

In this semiconductor structure, the oxide layer 101 is provided on the semiconductor substrate 100, and the recess W is provided on an upper surface of the oxide layer 101. The semiconductor structure further includes a TSV 222 provided in the semiconductor substrate and the oxide layer. Wherein, the TSV 222 is filled with a first conductive material, and an upper end of the TSV 222 is connected to the recess W. The metal layer 120 is provided on a surface of the recess W. The metal layer 120 on a bottom surface of the recess W is provided with one or more openings 121, which are connected to the TSV 222. The second conductive material 300 is filled into the recess. The hole 201 is formed in the second conductive material above the opening 121.

Further, the metal layer 120 may be a commonly used copper seed layer. The second conductive material and the first conductive material may be made of the same material, or different materials. The conductive materials may flow in the TSV and the hole through the opening. When thermal expansion occurs, the first conductive material in the TSV may enter the recess through the opening and be accommodated by the hole in the recess.

Preferably, the oxide layer 101 includes at least a first oxide layer and a second oxide layer, which are sequentially provided on the surface of the semiconductor substrate from bottom to top. The recess W is formed at the top of the second oxide layer. The oxide layer is specifically formed as follows: form a TSV in a lower surface of the semiconductor substrate, and fill the first conductive material in the TSV; expose a lower end of the TSV on the lower surface of the semiconductor substrate, and wrap an upper end of the TSV in the semiconductor substrate 100; remove an upper part of the semiconductor substrate 100 such that the upper end of the TSV protrudes from an upper surface of the semiconductor substrate 100; form a first oxide layer on the upper surface of the semiconductor substrate 100 such that the upper end of the TSV is wrapped in the first oxide layer, grind an upper surface of the first oxide layer such that the upper end of the TSV protrudes from the upper surface of the first oxide layer; form a second oxide layer on the upper surface of the first oxide layer such that the upper end of the TSV is wrapped in the second oxide layer; form a first mask layer on an upper surface of the second oxide layer, and pattern the first mask layer and the second oxide layer to form a recess W, where the upper end of the TSV is connected to the recess W; form a second mask layer on the TSV in the recess W, and form a metal layer 120 on the second oxide layer and the second mask layer, remove the metal layer 120 on the second mask layer, and pattern the second mask layer to form an opening in the metal layer 120; deposit the second conductive material 300 on the metal layer 120, and form a hole 201 above the opening in the recess; and remove the metal layer 120 and the second conductive material 300 in a non-recessed area on the second oxide layer.

The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

The exposed conductive structure 200 passes through the surface of the semiconductor substrate 100. The conductive material may be, but is not limited to, tungsten and copper and other related conductive materials used in an integrated circuit. Further, an insulating layer 210 is provided on a sidewall of the conductive structure 200. The insulating layer 210 may be made of silicon oxide or silicon nitride to prevent the conductive material from entering the semiconductor substrate or the oxide layer. The material of the insulating layer may preferably be silicon oxide or silicon nitride. In other embodiments, the material of the insulating layer 210 may also be other related insulating materials used in an integrated circuit, and is not limited to this embodiment. Further, the TSV is filled with a first conductive material (not shown). When the conductive structure 200 is formed by filling a conductive material in a TSV, the height of the insulating layer 210 may be smaller than the TSV, or it may be flush with TSV. In this case, the function of the insulating layer 210 is to electrically isolate the TSV from the substrate 100. In addition, an isolation layer may be provided between the insulating layer 210 and the conductive structure 200 to prevent the conductive material from migrating to the substrate and enhance the adhesion between the conductive material and the insulating layer.

The materials of the oxide layer 101 may include, but are not limited to, silicon dioxide, silicon nitride, silicon oxynitride and other related insulating materials used in an integrated circuit.

The recess has a size of 5-30 μm, that is, the recess has a depth of 5-30 μm. The recess may be a circular or a polygonal.

The metal layer 120 is made of copper. The metal layer 120 has a thickness of 100 nm. In order to facilitate the filling of a conductive material in the subsequent process, the copper seed layer may be formed in advance in this step.

The hole 201 and the opening 121 are arranged face to face. A radial distance of a cross section of the hole ranges from 2 to 20 μm. The cross section of the hole is a circular; the cross section of the hole is a polygon.

The material of the second conductive material 300 may be, but is not limited to, tungsten and copper and other related conductive materials used in an integrated circuit.

An embodiment of the present disclosure further provides a semiconductor device, which includes the above semiconductor structure. In embodiments of the disclosure, in an embodiment, referring to FIG. 8, the semiconductor device includes: a semiconductor substrate 100, a conductive structure 200, a hole 201 and a second conductive material 300.

The semiconductor device further includes an oxide layer 101. A first oxide layer and a second oxide layer are sequentially deposited on a surface of the semiconductor substrate 100 from bottom to top, and a recess W is formed at the top of the second oxide layer.

The semiconductor device further includes the recess W. The recess has a size of 5-30 μm, that is, the recess has a depth of 5-30 μm. The recess may be a circular or a polygonal.

The semiconductor device further includes a metal layer 120. The metal layer 120 is made of copper. The metal layer 120 has a thickness of 100 nm.

Compared with some TSV packaging technologies, the present disclosure improves the process of the depth of the contact surface of the metal pad and forms a hole in the metal layer as a buffer for the thermal expansion of the metal during hetero-bonding, thereby controlling the stability of the back-side via exposure device in the chemical-mechanical process, and also enhancing the ability of wafer bonding. Therefore, the present disclosure improves the performance and reliability of the semiconductor structure after packaging.

The above described are merely preferred embodiments of the present disclosure. It should be noted that several improvements and modifications may further be made by those of ordinary skill in the art without departing from the principle of the present disclosure, but such improvements and modifications should also be deemed as falling within the protection scope of the present disclosure.

What is claimed is:

1. A method of forming a semiconductor structure, comprising:
providing a semiconductor substrate;
forming an oxide layer on a surface of the semiconductor substrate, and etching the oxide layer to form a recess, wherein a through-silicon via is provided in the semiconductor substrate and the oxide layer, and an upper end of the through-silicon via is connected to the recess;
depositing a metal layer on a surface of the recess, and forming an opening in the metal layer on a bottom surface of the recess, wherein the opening is connected to the through-silicon via; and filling a second conductive material into the recess, and forming a hole in the second conductive material above the opening.

2. The method of forming a semiconductor structure according to claim 1, wherein the forming an oxide layer on a surface of the semiconductor substrate comprises: sequentially depositing a first oxide layer and a second oxide layer on the surface of the semiconductor substrate from bottom to top, wherein the recess is formed at a top of the second oxide layer.

3. The method of forming a semiconductor structure according to claim 1, wherein the forming an opening in the metal layer on a bottom surface of the recess comprises: forming a patterned mask layer on a bottom surface of the recess connected with the through-silicon via, depositing a metal layer on the surface of the recess, and removing the mask layer to transfer an aperture pattern to the metal layer.

4. The method of forming a semiconductor structure according to claim 3, wherein a pattern of the patterned mask layer is set to be a circular or a polygonal.

5. The method of forming a semiconductor structure according to claim 1, wherein after the filling a second conductive material into the recess, excess second conductive material on a surface of the oxide layer is planarized by a chemical mechanical polishing process.

6. The method of forming a semiconductor structure according to claim 1, wherein a radial distance of a cross section of the hole ranges from 2 to 20 µm.

7. The method of forming a semiconductor structure according to claim 1, wherein an insulating layer is deposited on a sidewall of the through-silicon via to isolate the through-silicon via from the semiconductor substrate and the oxide layer.

8. The method of forming a semiconductor structure according to claim 1, wherein the through-silicon via is filled with a first conductive material.

9. A semiconductor structure, comprising:
a semiconductor substrate;
an oxide layer, provided on a surface of the semiconductor substrate, and provided with a recess at the top;
a through-silicon via, formed in the semiconductor substrate and the oxide layer and filled with a first conductive material, wherein an upper end of the through-silicon via is connected to the recess; and
a metal layer, provided on a surface of the recess, wherein an opening is provided in the metal layer on a bottom surface of the recess; the opening is connected to the through-silicon via; the recess is filled with a second conductive material; a hole is formed in the second conductive material above the opening.

10. The semiconductor structure according to claim 9, wherein the oxide layer comprises at least a first oxide layer and a second oxide layer, the first oxide layer and the second oxide layer are sequentially deposited on the surface of the semiconductor substrate from bottom to top; the recess is formed at a top of the second oxide layer.

11. The semiconductor structure according to claim 9, wherein an insulating layer is provided on a sidewall of the through-silicon via to isolate the through-silicon via from the semiconductor substrate and the oxide layer.

12. The semiconductor structure according to claim 9, wherein the hole has a circular or a polygonal cross section.

13. A semiconductor device, comprising the semiconductor structure according to claim 9.

* * * * *